US006552630B2

United States Patent
Chueh et al.

(10) Patent No.: US 6,552,630 B2
(45) Date of Patent: Apr. 22, 2003

(54) BI-DIRECTIONAL LOW-PASS FILTER FOR USE AT USER END OR OFFICE END IN COMMUNICATION NETWORK

(75) Inventors: Her-Jun Chueh, Taipei (TW); Kuang-Che Chen, Taipei (TW)

(73) Assignee: Primax Electronics Ltd., Taipei (TW)

( * ) Notice: Subject to any disclaimer, the term of this patent is extended or adjusted under 35 U.S.C. 154(b) by 0 days.

(21) Appl. No.: 09/997,700

(22) Filed: Nov. 29, 2001

(65) Prior Publication Data

US 2003/0006860 A1 Jan. 9, 2003

(30) Foreign Application Priority Data

Jul. 9, 2001 (TW) ........................................ 90116761 A
Aug. 10, 2001 (TW) ....................................... 90116761A01

(51) Int. Cl.[7] ................................................ H03H 7/06
(52) U.S. Cl. ........................ 333/172; 333/177; 333/181; 379/399.01
(58) Field of Search ................................ 333/172, 175, 333/176, 177, 181, 185; 379/399.01, 398

(56) References Cited

U.S. PATENT DOCUMENTS

| | | | | |
|---|---|---|---|---|
| 5,848,150 A | * | 12/1998 | Bingel | 379/399.01 |
| 6,137,880 A | * | 10/2000 | Bella | 379/399.01 |
| 6,212,259 B1 | * | 4/2001 | Kiko | 379/30 |
| 6,285,754 B1 | * | 9/2001 | Sun et al. | 379/399.02 |
| 6,418,221 B1 | * | 7/2002 | Snow et al. | 379/399.01 |

FOREIGN PATENT DOCUMENTS

WO   WO-200028660 A1   *   5/2000

* cited by examiner

*Primary Examiner*—Seungsook Ham
(74) *Attorney, Agent, or Firm*—Mathews, Collins, Shepherd & McKay, P.A.

(57) ABSTRACT

A bi-directional low-pass filter for use at a user end or an office end in a communication network is disclosed. By providing compensation and high-band attenuation circuitry, the low-pass filter exhibits an improved attenuation value in high-band and a general attenuation value in a low-frequency band. The satisfactory attenuation performance in the high-frequency band minimizes the signal interference of a high-band communication terminal with a low-band communication terminal in the communication network. Further, by providing symmetric input/output circuitry, the low-pass filter can be operated reversibly.

9 Claims, 5 Drawing Sheets

BI-DIRECTIONAL LOW-PASS FILTER FOR USE AT USER END OR OFFICE END IN COMMUNICATION NETWORK

FIELD OF THE INVENTION

The present invention relates to a low-pass filter for use at a user end or office end in a communication network, and more particularly to a bi-directional low-pass filter for use at a user end or office end in a communication network.

BACKGROUND OF THE INVENTION

In order to enhance the data transmission rate in the internet, various techniques for broadband linkage are developed. For example, Digital Subscriber Line (DSL) uses copper wires common to general users to perform high-speed data transmission. Nowadays, many different versions of DSL techniques have been derived, and they are generally known as xDSL. Among them, the most popular one, so far, is Asymmetric Digital Subscriber Line (ADSL).

Please refer to FIG. 1 which is a schematic diagram showing the application structure of ADSL. As shown, voice grade terminals 11 such as telephone sets or fax machines, and a remote terminal end 12 of an ADSL transceiver unit (ATU-R) share a conventional telephone line 10 to perform transmission therefor. The telephone line 10 is connected to a central office end 14 via a network interface device (NID) 13.

In general, ADSL utilizes a high frequency band, e.g. 25 kHz to 1 MHz, of the telephone line 10 to transmit information in the internet. Therefore, in principle, a low frequency band, e.g. a voice band, of the telephone line 10 can be provided for the voice grade terminals 11 to make a phone call or fax. In practice, however, the signal in the high frequency band may interfere with the signal in the low frequency band so as to adversely effect the telephone or facsimile communication quality relating to attenuation values. In order to solve this problem, low-pass filters 111 are provided between respective voice grade terminals 11 and the telephone line 10. The circuit of each low-pass filter 111 is optionally arranged inside or outside the housing of the corresponding voice grade terminal 11. FIG. 2 shows a circuit diagram of a conventional low-pass filter.

As shown in FIG. 2, it is clear that the conventional low-pass filter has to be mounted in a designated direction, i.e. input from the telephone line, and output to the voice grade terminal. If the filter is mounted incorrectly, the overall transmission efficiency of the network will be lowered.

SUMMARY OF THE INVENTION

Therefore, an object of the present invention is to provide a low pass filter which can be operated reversibly.

Another object of the present invention is to provide a low pass filter which has a satisfactory attenuation property in high-band.

The present invention relates to a low-pass filter for use in a communication network. The communication network includes a high-band communication terminal, a low-band communication terminal, and a signal channel common to the high-band and low-band communication terminals. For example, the communication network may include a home PNA client as the high-band communication terminal, a voice grade terminal as the low-band communication terminal, and a telephone line as the signal channel.

A first aspect of the present invention relates to a bi-directional low-pass filter which includes a first, a second, a third and a fourth input/output ends; a first, a second, a third and a fourth inductors electrically connected to the first, second, third and fourth input/output ends, respectively; a first capacitor having a first and a second ends; a fifth, a sixth, a seventh and an eighth inductors arranged in a manner that the fifth and sixth inductors are electrically connected to the first and second inductors, respectively, and further to the first end of the first capacitor in series, and the seventh and eighth inductors are electrically connected to the third and fourth inductors, respectively, and further to the second end of the first capacitor in series; and a first, a second, a third and a fourth compensation circuits electrically connected to the fifth, sixth, seventh and eighth inductors in parallel, each of the compensation circuits including a compensation capacitor and a compensation resistor interconnected in series.

A second aspect of the present invention relates to a bi-directional low-pass filter which includes a first, a second, a third and a fourth input/output ends; a first, a second, a third and a fourth inductors electrically connected to the first, second, third and fourth input/output ends, respectively; a first capacitor having a first and a second ends; a fifth, a sixth, a seventh and an eighth inductors arranged in a manner that the fifth and sixth inductors are electrically connected to the first and second inductors, respectively, and further to the first end of the first capacitor in series, and the seventh and eighth inductors are electrically connected to the third and fourth inductors, respectively, and further to the second end of the first capacitor in series; a first, a second, a third and a fourth compensation circuits electrically connected to the fifth, sixth, seventh and eighth inductors in parallel, each of the compensation circuits including a compensation capacitor and a compensation resistor interconnected in series; and a first, a second, a third and a fourth high-band attenuation circuits electrically connected to the compensation resistors of the first, second, third and fourth compensation circuits in parallel, respectively, each of the high-band attenuation circuits including a high-band attenuation inductor and a high-band attenuation resistor.

The first and the fourth input/output ends are electrically connected to the signal channel, and the second and third input/output ends are electrically connected to the low-band communication terminal. Alternatively, the first and the fourth input/output ends are electrically connected to the low-band communication terminal and the second and third input/output ends are electrically connected to the signal channel.

Preferably the first, fifth, eighth and fourth inductors are wound around a first core, and the second, sixth, seventh and third inductors are wound around a second core.

Preferably, an inductance of each of the first, second, third and fourth inductors is 0.5 mH, and an inductance of each of the fifth, sixth, seventh and eighth inductors is 0.75 mH. A capacitance of the compensation capacitor is ranged between 1000 pf and 35 nf, and a resistance of the compensation resistor is ranged between 10 Ω and 10 kΩ. A capacitance of the first capacitor is ranged between 4.7 nf and 22 nf. An inductance of the high-band attenuation inductor is ranged between 300 μH and 2.0 mH, and a resistance of the high-band attenuation resistor is ranged between 10 Ω and 1 kΩ.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
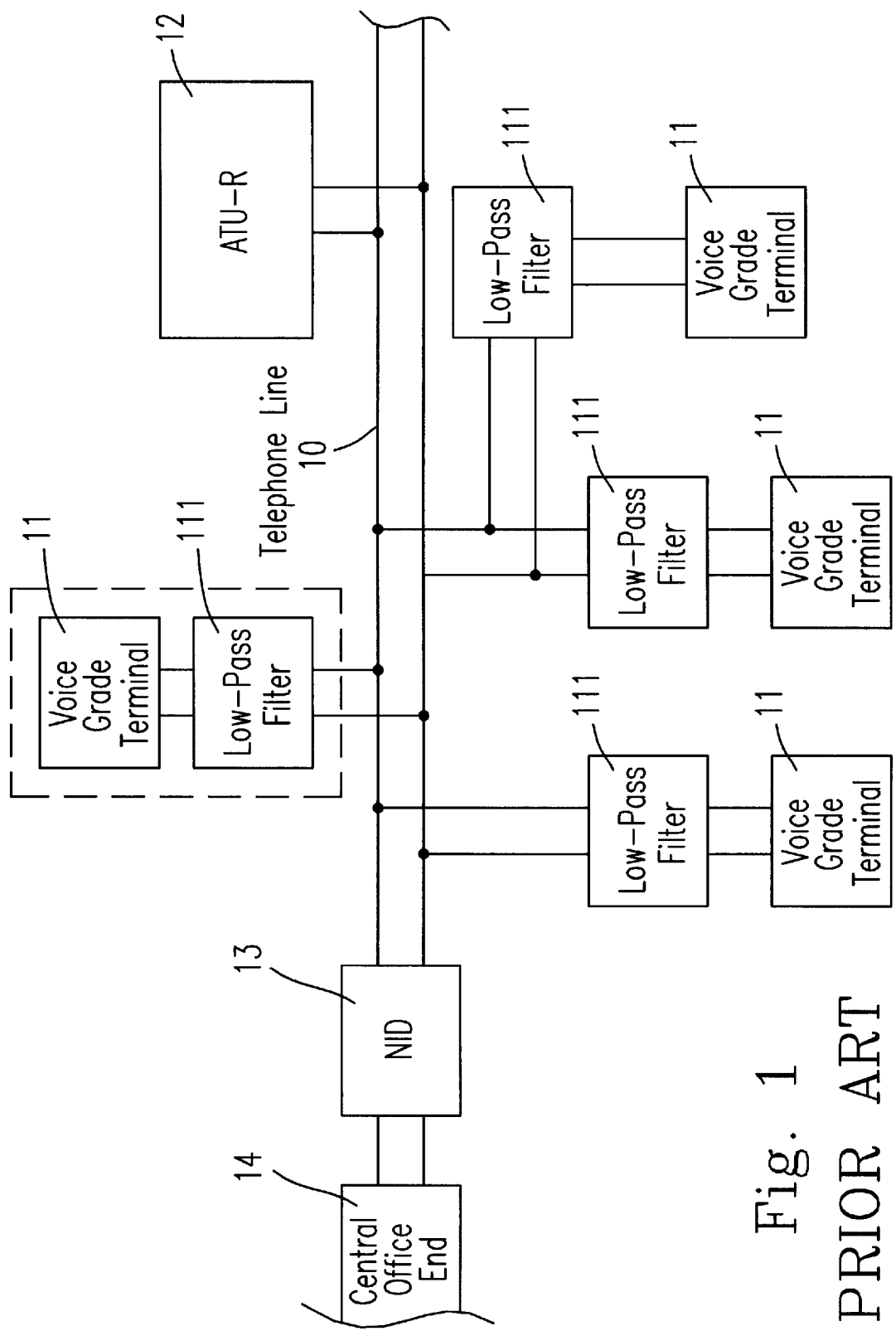
FIG. 1 is a schematic block diagram showing the application structure of ADSL.
Figure 2:
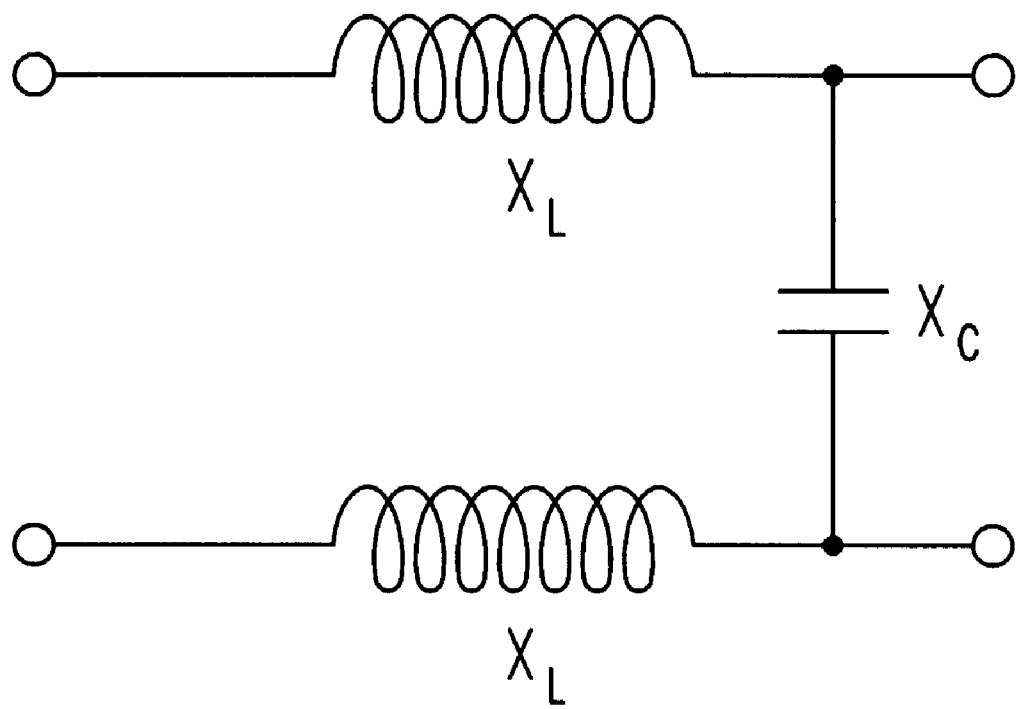
FIG. 2 is a circuit diagram of a conventional low-pass filter.
Figure 3:
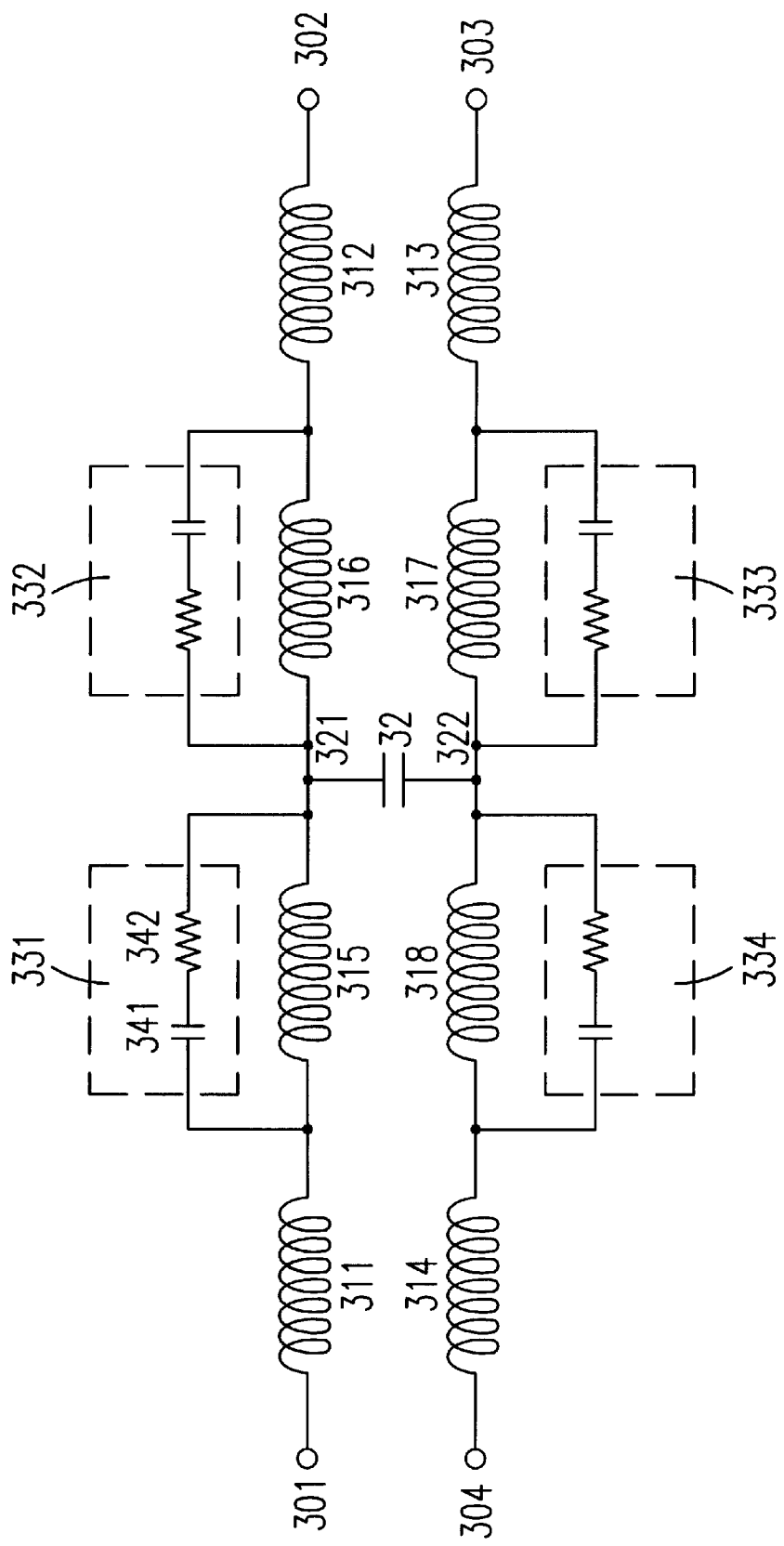
FIG. 3 is a circuit diagram of a first embodiment of a bi-directional low-pass filter according to the present invention.

Please refer to FIG. 3 which is a circuit diagram of a first embodiment of a bi-directional low-pass filter according to the present invention. As shown, the low-pass filter includes a number of pins 301, 302, 303 and 304. Each of the pins optionally serves as an input pin or an output pin, depending on how the low-pass filter is mounted in the communication network. For example, the two pins 301 and 304 are electrically connected to a telephone line (not shown) as input ends, and the two pins 302 and 303 are electrically connected to a voice grade terminal (not shown) as output ends. Alternatively, the two pins 302 and 303 are electrically connected to a telephone line (not shown) as input ends, and the two pins 301 and 304 are electrically connected to a voice grade terminal (not shown) as output ends. The filter further includes a first, a second, a third and a fourth inductors 311, 312, 313, 314 electrically connected to the input/output ends 301, 302, 303 and 304 in series, respectively, a fifth and a sixth inductors 315 and 316 electrically connected to the first and the second inductors 311 and 312, and further to a first end 321 of a capacitor 32 in series, respectively, and a seventh and an eighth inductors 317 and 318 electrically connected to the third and the fourth inductors 313 and 314, and further to a second end 322 of the capacitor 32 in series, respectively.

In order to enhance the attenuation performance of the low-pass filter in the high-frequency band without significantly influencing the attenuation value in the low-frequency band, four compensation circuits 331, 332, 333 and 334 are electrically connected to the fifth, the sixth, the seventh and the eighth inductors 315, 316, 317 and 318 in parallel, respectively. Each of the compensation circuits includes a capacitor 341 and a resistor 342.

It is clear that the circuitry of the above embodiment is made symmetric so that the present filter can be operated reversibly.

Figure 4A:
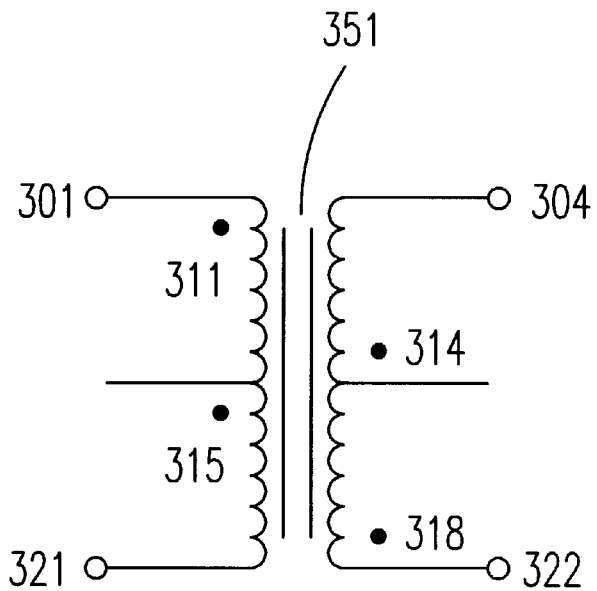
FIG. 4A is a schematic diagram showing the arrangement of the first to the fourth inductors of FIG. 3.
Figure 4B:
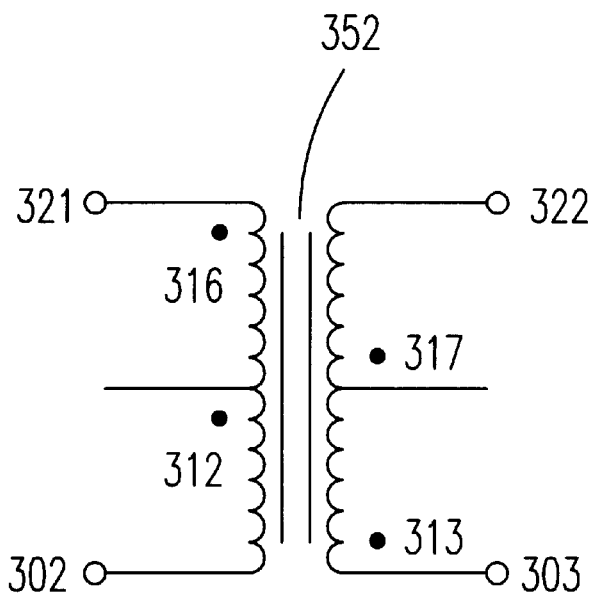
FIG. 4B is a schematic diagram showing the arrangement of the fifth to the eighth inductors of FIG. 3.

Please refer to FIGS. 4A and 4B. The inductors 311, 315, 318 and 314 of FIG. 3 are wound around a common core 351, and the inductors 316, 312, 313 and 317 of FIG. 3 are wound around a common core 352 so as to reduce space and cost.

Hereinafter an example is given as follows to exemplify the practice of the bi-directional low-pass filter according to the present invention. The inductance of each of the inductors 311, 312, 313 and 314 is 0.5 mH. The inductance of each of the inductors 315, 316, 317 and 318 is 0.75 mH. The capacitance of the compensation capacitor 341 is ranged between 1000 pf and 35 nf. The resistance of the compensation resistor 342 is ranged between 10 Ω and 10 kΩ. The capacitance of the capacitor 32 is ranged between 4.7 nf and 22 nf.

Figure 5:
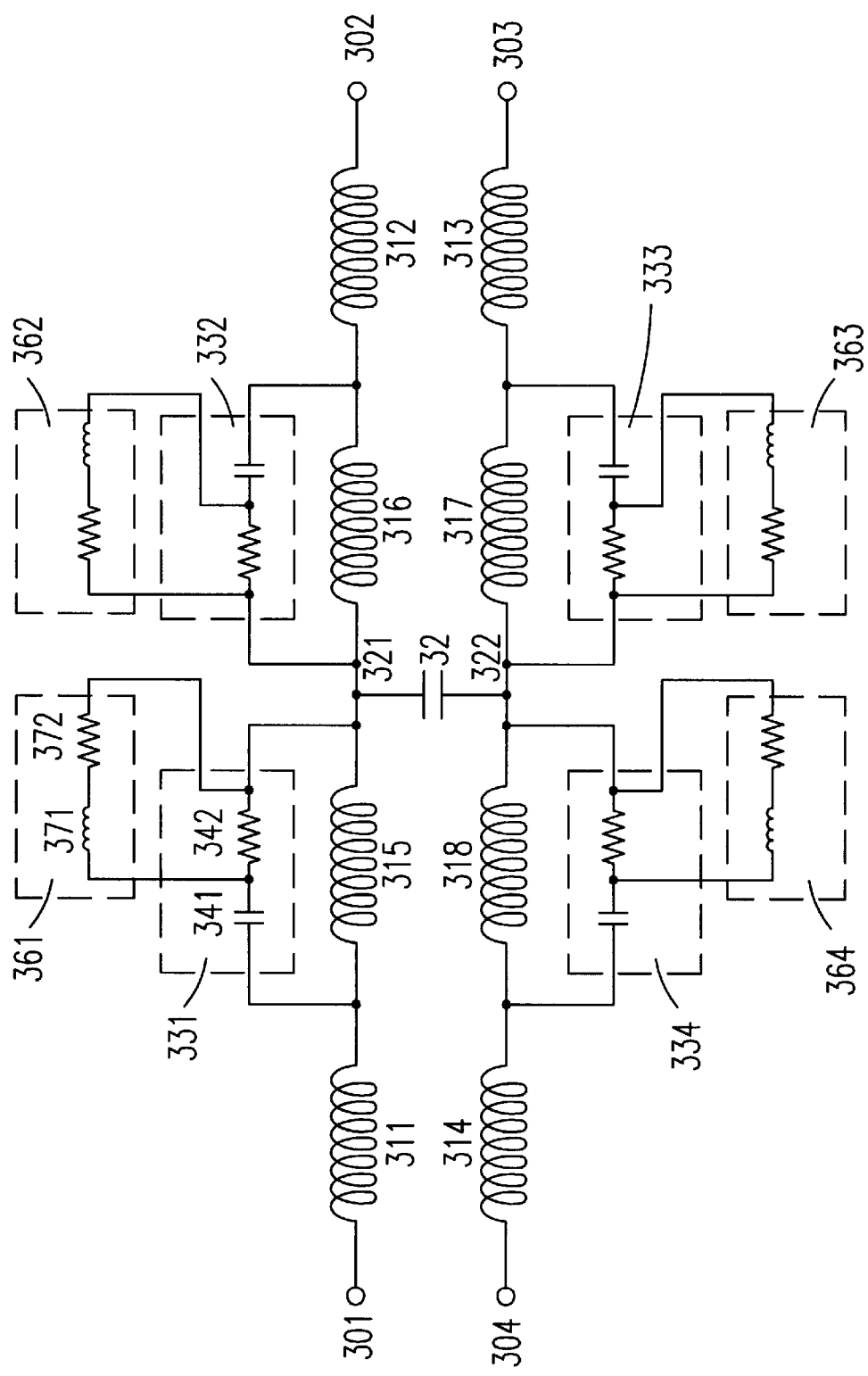
FIG. 5 is a circuit diagram of a second embodiment of a bi-directional low-pass filter according to the present invention.

Please refer to FIG. 5 which is a circuit diagram of a second embodiment of a bi-directional low-pass filter according to the present invention. The filter includes input/output ends 301~304, inductors 311~318, capacitors 32, and compensation circuits 331~334 similar to the corresponding ones of the filter of FIG. 3. The inductors 311~318 can be arranged in a manner as shown in FIGS. 4A and 4B. In addition, the filter of FIG. 5 includes high-band attenuation circuits 361, 362, 363 and 364 electrically connected to the resistors 342 of the compensation circuits 331~334 in parallel, respectively, for further improving the attenuation effect in high-band. Each of the high-band attenuation circuits 361, 362, 363 and 364 includes a high-band attenuation inductor 371 and a high-band attenuation resistor 372 interconnected in series.

Hereinafter, an example is given as follows to exemplify the practice of the bi-directional low-pass filter according to the present invention. The inductance of each of the inductors 311, 312, 313 and 314 is 0.5 mH. The inductance of each of the inductors 315, 316, 317 and 318 is 0.75 mH. The capacitance of the compensation capacitor 341 is ranged between 1000 pf and 35 nf. The resistance of the compensation resistor 342 is ranged between 10 Ω and 10 kΩ. The capacitance of the capacitor 32 is ranged between 4.7 nf and 22 nf. The inductance of the high-band attenuation inductor 371 is ranged between 300 μH and 2.0 mH. The resistance of the high-band attenuation resistor 372 is ranged between 10 Ω and 1 kΩ.

According to the present invention, the low-pass filter according to the present invention exhibits an improved attenuation value in a high-frequency band and a general attenuation value in a low-frequency band, thereby minimizing signal interference of a communication system as well as following the stipulations of the communication system, e.g. the performance criteria stipulated by TIE1.4. Therefore, the low-pass filter according to the present invention is suitable to be used at a user end or an office end of a communication network such as xDSL, G. Lite, or Home PNA. Further, the present low-pass filter can be operated bi-directionally. The principles are understood by those skilled in the art by referring to the above description, so it is not to be redundantly described herein.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A bi-directional low-pass filter for use in a communication network, said communication network including a high-band communication terminal, a low-band communication terminal, and a signal channel common to said high-band and low-band communication terminals, said low-pass filter comprising:

a first, a second, a third and a fourth input/output ends;

a first, a second, a third and a fourth inductors electrically connected to said first, second, third and fourth input/output ends, respectively;

a first capacitor having a first and a second ends;

a fifth, a sixth, a seventh and an eighth inductors arranged in a manner that said fifth and sixth inductors are electrically connected to said first and second inductors, respectively, and further to said first end of said first capacitor in series, and said seventh and eighth inductors are electrically connected to said third and fourth inductors, respectively, and further to said second end of said first capacitor in series;

a first, a second, a third and a fourth compensation circuits electrically connected to said fifth, sixth, seventh and eighth inductors in parallel, each of said compensation circuits including a compensation capacitor and a compensation resistor interconnected in series; and a first, a second, a third and a fourth high-band attenuation circuits electrically connected to said compensation resistors of said first, second, third and fourth compensation circuits in parallel, respectively, each of said high-band attenuation circuits including a high-band attenuation inductor and a high-band attenuation resistor.

2. The bi-directional low-pass filter according to claim 1 wherein said first and said fourth input/output ends are electrically connected to said signal channel, and said second and third input/output ends are electrically connected to said low-band communication terminal.

3. The bi-directional low-pass filter according to claim 1 wherein said first and said fourth input/output ends are electrically connected to said low-band communication terminal and said second and third input/output ends are electrically connected to said signal channel.

4. The bi-directional low-pass filter according to claim 1 wherein said first, fifth, eighth and fourth inductors are wound around a first core, and said second, sixth, seventh and third inductors are wound around a second core.

5. The bi-directional low-pass filter according to claim 4 wherein an inductance of each of said first, second, third and fourth inductors is 0.5 mH, and an inductance of each of said fifth, sixth, seventh and eighth inductors is 0.75 mH.

6. The bi-directional low-pass filter according to claim 1 wherein a capacitance of said compensation capacitor is ranged between 1000 pf and 35 nf, and a resistance of said compensation resistor is ranged between 10 Ω and 10 kΩ.

7. The bi-directional low-pass filter according to claim 1 wherein a capacitance of said first capacitor is ranged between 4.7 nf and 22 nf.

8. The bi-directional low-pass filter according to claim 1 wherein an inductance of said high-band attenuation inductor is ranged between 300 $\mu$H and 2.0 mH, and a resistance of said high-band attenuation resistor is ranged between 10 Ω and 1 kΩ.

9. The use of the bi-directional low-pass filter according to claim 1 in a communication network including a home PNA client as said high-band communication terminal, a voice grade terminal as said low-band communication terminal, and a telephone line as said signal channel.

* * * * *